United States Patent
Kunihiro

[11] Patent Number: 6,060,734
[45] Date of Patent: May 9, 2000

[54] MESFIELD EFFECT TRANSISTOR

[75] Inventor: Kazuaki Kunihiro, Tokyo, Japan

[73] Assignee: NEC Corporation, Tokyo, Japan

[21] Appl. No.: 09/094,925

[22] Filed: Jun. 15, 1998

[30] Foreign Application Priority Data

Jun. 16, 1997 [JP] Japan ................................. 9-158557

[51] Int. Cl.[7] .............................................. H01L 29/812
[52] U.S. Cl. ...................... 257/284; 257/473; 257/635; 257/638; 257/640
[58] Field of Search .................................. 257/280, 284, 257/629, 632, 635, 638, 640

[56] References Cited

U.S. PATENT DOCUMENTS

| | | | |
|---|---|---|---|
| 5,376,812 | 12/1994 | Oku | 257/280 |
| 5,548,144 | 8/1996 | Kohno | 257/280 |
| 5,675,159 | 10/1997 | Oku et al. | 257/284 |
| 5,698,888 | 12/1997 | Fukaishi | 257/284 |
| 5,796,132 | 8/1998 | Nakano et al. | 257/284 |

FOREIGN PATENT DOCUMENTS

| | | |
|---|---|---|
| 1-268067 | 10/1989 | Japan . |
| 2-271538 | 11/1990 | Japan . |
| 5-291301 | 11/1993 | Japan . |

*Primary Examiner*—Gene M. Munson
*Attorney, Agent, or Firm*—Hutchins, Wheeler & Dittmar

[57] ABSTRACT

In the manufacture of a field effect transistor which can improve the breakdown voltage between a gate and a drain and can also prevent a gate lag, an oxide film is formed or wet cleaning is carried out over the semiconductor surface of an inter-source-gate region while a nitride film is formed or dry cleaning is carried out over the semiconductor surface of an inter-gate-drain region, in order that surface traps in the semiconductor surface of the inter-gate-drain region, which is not covered with electrode metal, is greater in number than those in the semiconductor surface of the inter-source-gate region.

11 Claims, 7 Drawing Sheets

6,060,734

MESFIELD EFFECT TRANSISTOR

BACKGROUND OF THE INVENTION

1. Field of the Invention

The present invention relates to a field effect transistor structure and a method of manufacturing a MESFET (metal semiconductor field effect transistor), and more particularly to a field effect transistor which is high in breakdown voltage and is hence free from any gate lag.

2. Description of the Related Art

FIGS. 7(a) to 7(h) of the accompanying drawings show a conventional power field effect transistor (hereinafter also called FET) structure and its fabrication method. In this conventional fabrication method, firstly with a photoresist 6 as a mask, a gate recess 7 is formed in an n-GaAs (gallium, arsenic) layer 20 (FIG. 7(a)), and then a 7000-angstrom-thick $SiO_2$ (silicon oxide) film 4 is deposited. Then, as a mask for dry etching, a WSi (tungsten silicide) film 8 is deposited by sputtering, and with a photoresist 9 as a mask over the WSi film 8, the WSi film 8 is etched by magnetron ion etching (MIE) and then the $SiO_2$ film 4 is etched firstly by reactive ion etching (RIE) and, after the photoresist 9 has been removed, secondly by magnetron ion etching until the n-GaAs layer 20 is exposed (FIG. 7(b)). A gate metal (Wsi and TiNi/Pt/Au/Ti) 1 is deposited on the $SiO_2$ film 4 by sputtering and evaporation (FIG. 7(c)) and is then shaped into an gate-electrode shape by ion milling (FIG. 7(d)). After the beneath-gate $SiO_2$ film 4 is removed by vapor etching, a 1000-angstrom-thick $SiO_2$ passivation film 5 is deposited by low pressure CVD (FIG. 7(e)), and ohmic metals (AuGeNi) 2, 3 and a silicon nitride($Si_xN_y$) passivation film 10 are formed one after another (FIG. 7(f)). At that time, before formation of the $SiO_2$ passivation film 5, the device is dipped in dilute hydrochloric acid for a short time to clean the semiconductor surfaces. As a substitute for dilute hydrochloric acid, oxygen plasma may be used for cleaning the semiconductor surface. Then a photoresist 11 is patterned for formation of electrodes, whereupon an electrode metal (Ti/Pt/Au) 12 serving also as a conductor path during plating gold is deposited by sputtering (FIG. 7(g)). Subsequently with the photoresist as a mask, a gold electrode 13 of an approximately 3 µm thickness is formed by plating gold, and then with the gold electrode 13 as a mask, the unnecessary part of the electrode metal 12 is removed by ion milling. Thus fabrication of the field effect transistor has been completed (FIG. 7(h)).

In a power field effect transistor, a breakdown voltage between the gate and drain or a breakdown voltage between the source and drain is significant parameters for determining a maximum output power of the device. These breakdown voltages are known to be delicately dependent on the kind of the $SiO_2$ passivation film 5 and its fabrication method or the method of cleaning the semiconductor surface before formation of the $SiO_2$ passivation film in the example of FIGS. 7(a) to 7(h). According to the experiences, if a passivation film and a process such as to improve the breakdown voltage of the device are used, a phenomenon that the drain current responds late with respect to the gate voltage application tends to become remarkable. In other words, there is a contracting relationship between increase of breakdown voltage of the device and reduction of the gate lag; that is, it is difficult to satisfy both at the same time.

SUMMARY OF THE INVENTION

It is therefore an object of the present invention to provide a field effect transistor structure which can accomplish improvement of a breakdown voltage in an inter-gate-drain region between the gate and drain and reduction of a gate lag at the same time and also to provide a method of manufacturing such a field effect transistor.

According to the present invention, the foregoing problems can be solved by individually forming a first passivation film, which surface traps are difficult to provide in an inter-source-gate region between the source and gate and a second passivation film, which surface traps are easy to provide in an inter-gate-drain region between the gate and drain. Namely, the above object accomplished by a field effect transistor comprising: a source electrode; a drain electrode; a gate electrode; and a surface passivation film covering at least transistor surfaces of inter-source-gate and inter-gate-drain regions uncovered with their respective electrode metals; surface traps to be provided over the semiconductor surface of the inter-gate-drain region being higher in number than those to be provided over the semiconductor surface of the inter-source-gate region.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1A:
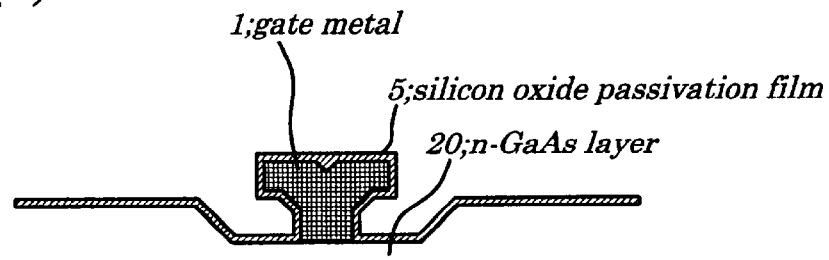
FIGS. 1(a) to 1(d) are schematic cross-sectional views showing a succession of process steps of fabrication of a field effect transistor according to a first embodiment of the present invention.
Figure 1B:
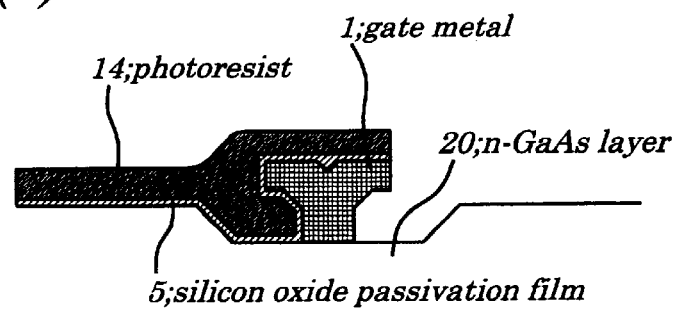
Figure 1C:
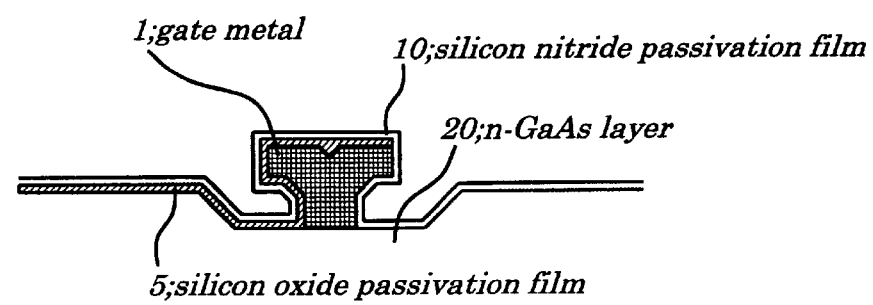
Figure 1D:
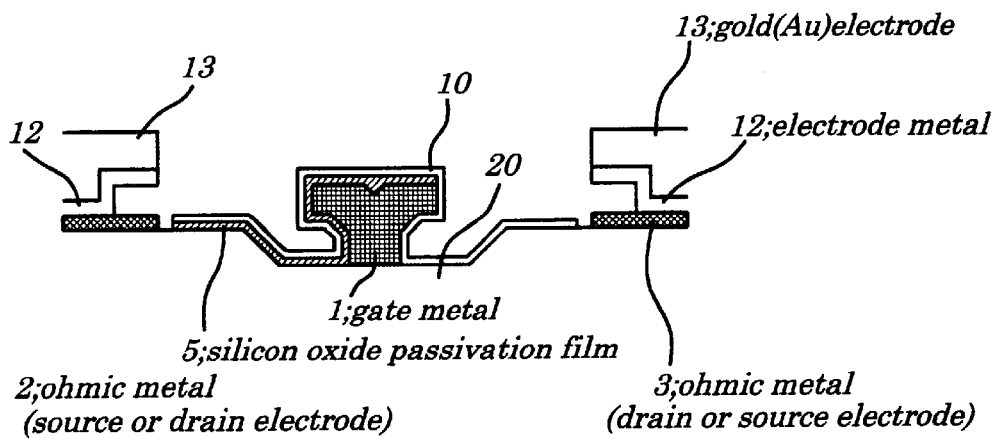

The principles of the present invention are particularly useful when applied to a field effect transistor and its fabrication process, various embodiments of which will now be described in detail with reference to the accompanying drawings.

It is known that in the conventional technology, as described above in connection with FIGS. 7(a) to 7(h), if a passivation film 5 is formed after the beneath-gate $SiO_2$ film 4 has been removed and then dry preprocessed with $O_2$ plasma or $NH_3$ plasma, improvement of the breakdown voltage of the field effect transistor can be achieved. This is true because a damage layer, i.e., many surface traps are formed on the semiconductor surface by plasma irradiation to increase the resistance between the gate and drain and to increase a potential drop between the gate and drain so that electromagnetic fields cannot concentrate on the field effect transistor (beneath the gate in case of two-terminal structure). It can be thought that the damage layer on the semiconductor surface would contain deep impurity traps, which would be a cause for FET malfunction called a gate lag that current responds late with respect to the change of a gate voltage. To increase the breakdown voltage of FET would require only to increase the resistance between the gate and drain, and no damage layer would be necessary between the source and gate.

Consequently, in the present invention, the semiconductor surface of the inter-gate-drain region is cleaned by plasma irradiation, and the semiconductor surface of the inter-source-gate region is wet preprocessed with, for example, dilute hydrochloric acid, which would cause less damage, rather than exposed to plasma irradiation. As a result, it is possible to obtain a structure that would realize prevention of a gate lag and, at the same time, increase the breakdown voltage of FET.

In the conventional process steps (FIGS. 7(a) to 7(h)), a new passivation film 5 is formed after the beneath-gate $SiO_2$ film 4 has been removed. During removing the beneath-gate $SiO_2$ film 4 and forming the passivation film 5, since the semiconductor surface is exposed, formation of a certain damage layer could not be avoided due to any surface process. And since the beneath-gate $SiO_2$ film 4 is left unremoved until the final process step, the semiconductor surface is not exposed during fabrication process of FET so that formation of a possible damage layer would be reduced to a minimum. Accordingly, by removing the beneath-gate $SiO_2$ film 4 from the inter-gate-drain region with the beneath-gate $SiO_2$ film 4 left remaining in the inter-source-gate region, the present invention can be realized according the described principles.

A $SiO_2$ film can be deposited usual at approximately 300 to 400° C. by thermal CVD, making occurrences of interface traps relatively less. And a silicon nitride($Si_xN_y$) film must reacts at high temperature during its formation. Thermal CVD is currently not often used in fabrication process of GaAsFET, and instead, plasma CVD, in which reactive gas is ionized as plasma to deposit a nitride film, is currently widely used. In plasma CVD, a nitride film can be formed at low temperature, and surface traps tend to provide. If a nitride film could be formed by thermal CVD, it requires at least 550° C. causing As (arsenic) to become vaporized from the GaAs (gallium, arsenic) surface in order to cause thermal reaction, so that the semiconductor surface would inevitably be damaged. For this reason, a nitride film would tend to be encountered with surface damages compared to an oxide film. Accordingly, by forming an oxide film on the semiconductor surface of the inter-source-gate region and a nitride film on the semiconductor surface of the inter-gate-drain region, it is also possible to realize the present invention according to the described principles.

First Embodiment

FIGS. 1(a) to 1(d) are schematic cross-sectional views showing a succession of process steps of fabrication of a field effect transistor according to a first embodiment of the invention. Firstly the process steps similar to those of FIGS. 7(a) to 7(e) are carried out, whereupon a 1000-angstrom-thick oxide film 5 is formed over the entire circuit element by low pressure CVD (FIG. 1(a)). Then a photoresist 14 is coated over the oxide film 5, and only an inter-gate-drain region between the gate and drain is opened, whereupon the oxide film 5 of the inter-gate-drain region is removed by dry etching (using $CF_4+O_2$) (FIG. 1(b)). After the photoresist 14 has been removed, a 1000-angstrom-thick silicon nitride passivation film 10 is formed by plasma CVD ($NH_3+SiH_4$ (ammonia+monosilane), 200 W) (FIG. 1(c)). Taking these process steps, the oxide film and the nitride film are formed over the semiconductor surface at the inter-source-gate region and the inter-gate-drain region, respectively. In the oxide film there are less surface traps, while in the nitride film there are many surface traps. As a result, like the process steps 7(f) to 7(h), ohmic electrodes 2, 3, an electrode metal 12, a gold (Au) electrode 13, etc. are formed to finalize fabrication process of a field effect transistor of the invention (FIG. 1(d)).

In this embodiment, the oxide film 5 is removed off only the inter-gate-drain region. Alternatively with the inter-source-gate and inter-gate-drain regions masked by the respective photoresists, the oxide film 5 and the nitride film 10 may be formed over the exposed semiconductor surfaces.

Second Embodiment

Figure 2A:
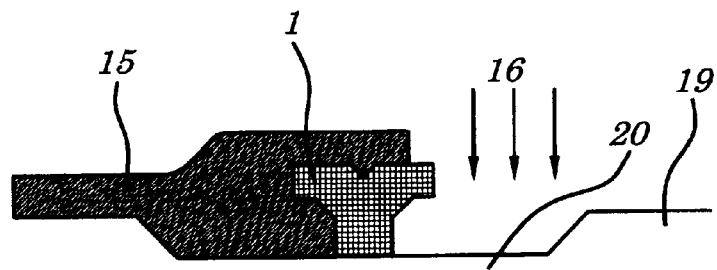
FIGS. 2(a) to 2(c) are schematic cross-sectional views showing a succession of process steps of fabrication of a field effect transistor according to a second embodiment of the invention.
Figure 2B:
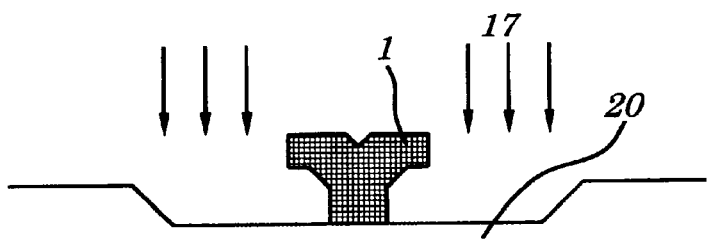
Figure 2C:
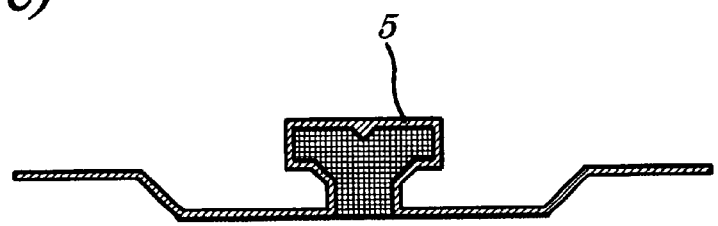

FIGS. 2(a) to 2(c) are schematic cross-sectional views showing a succession of process steps of fabrication of a field effect transistor according to a second embodiment of the invention. In this embodiment, before an oxide film 5 is formed as a surface passivation film, the semiconductor surface of an inter-source-gate region is covered with a photoresist 15 with only the semiconductor surface of an inter-gate-drain region remaining exposed so that a wafer is exposed to $O_2$ plasma ambient 16 for 30 minutes (FIG. 2(a)). After the photoresist 15 is removed, the wafer is dipped in dilute hydrochloric acid 17 for two minutes (FIG. 2(b)). Then a 1000-angstrom-thick oxide film 5 is deposited by thermal CVD (FIG. 2(c)). Taking these preprocesses for formation of the surface passivation film, there are less surface damages in the inter-source-gate region while there is a surface-damage layer in the inter-gate-drain region, thus realizing the present invention. These process steps are carried out immediately before the process step of FIG. 7(e), and then the process steps 7(f) to 7(h) are repeated to obtain the field effect transistor of the invention. In the process step of FIG. 2(a), $NH_3$ plasma irradiation (200 W, 30 minutes) may be substituted for $O_2$ plasma irradiation with the same results.

Figure 5:
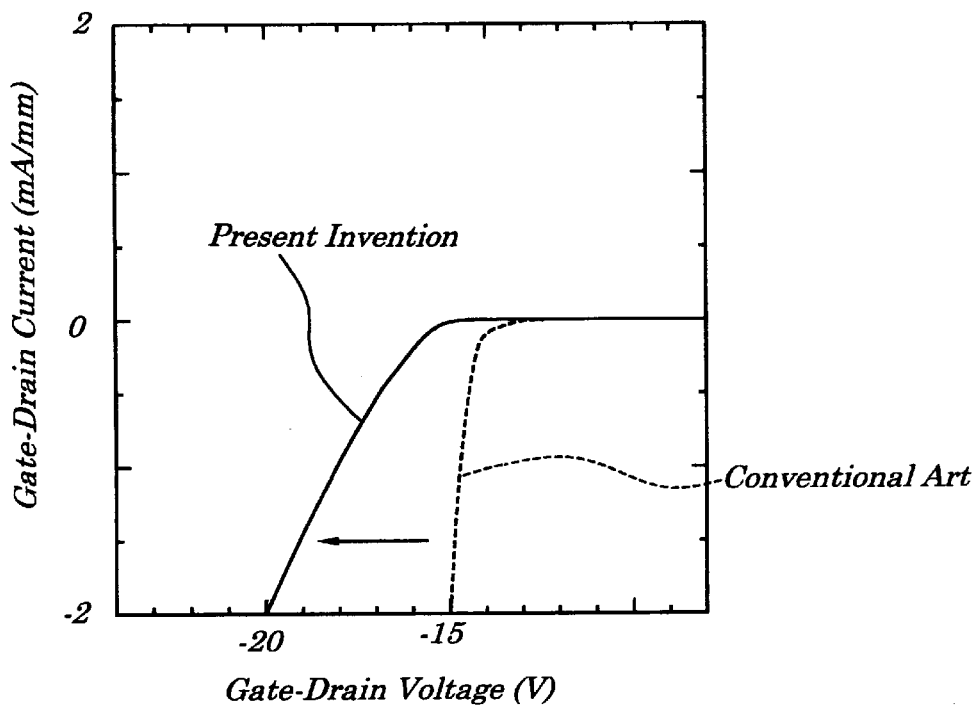
FIG. 5 is a graph showing results of measurement of the breakdown voltage in an inter-gate-drain region of the field effect transistor of the invention in comparison with those of the conventional field effect transistor.

When a positive voltage was applied between the gate and drain in each of the field effect transistor of the present invention and that of the conventional art of FIGS. 7(a) to (h), a voltage point (1 mA/mm) where a current increases sharply was measured as a two-terminal breakdown voltage. The larger this voltage value, the field effect transistor is excellent as a power FET. The results of this measurement are shown in FIG. 5. As shown in FIG. 5, in the conventional field effect transistor the breakdown voltage between the gate and drain was 15 V, and in the present invention the breakdown voltage was improved to 20 V. This was an effect that a damage layer was formed in the inter-gate-drain region according to the present invention. The quantity of damage may be controlled by varying the RF power or the substrate voltage. When the RF power of $NH_3$ plasma was increased from 200 W to 700 W, the breakdown voltage was improved from 20 V to 25 V. Alternatively when the substrate bias was increased from 35 V to 45 V, the breakdown voltage was improved.

Third Embodiment

Figure 3A:
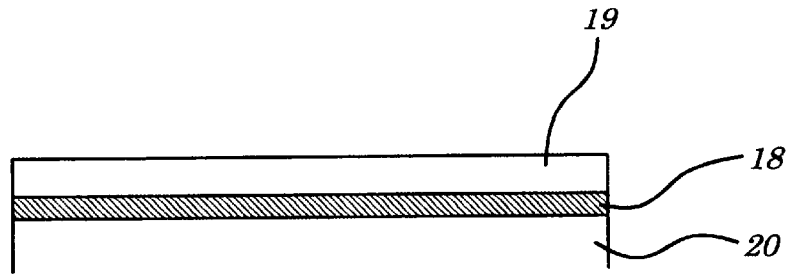
FIGS. 3(a) to 3(c) are schematic cross-sectional views showing a succession of process steps of fabrication of a field effect transistor according to a third embodiment of the invention.
Figure 3B:
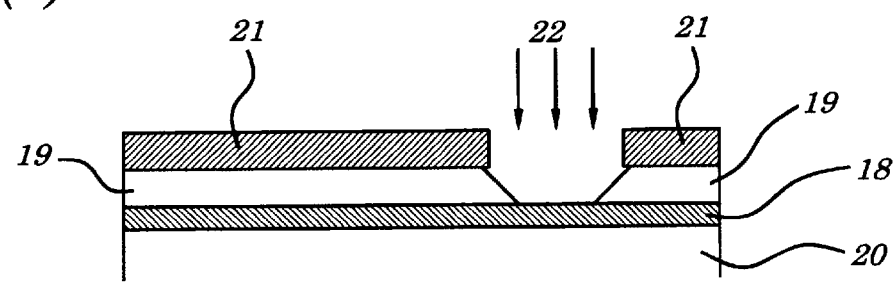
Figure 3C:
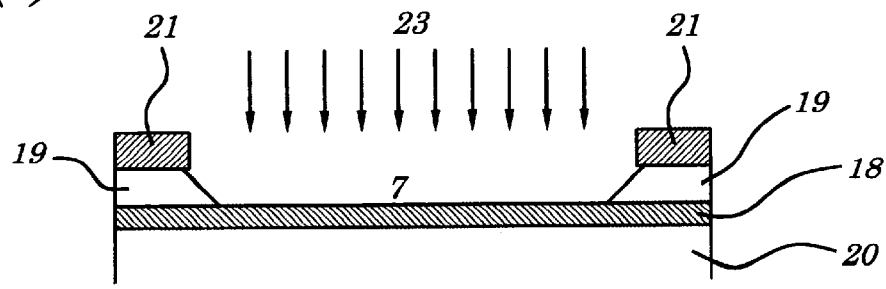

FIGS. 3(a) to 3(c) are schematic cross-sectional views showing a succession of process steps of fabrication of a field effect transistor according to a third embodiment of the invention. In this embodiment, a 100-angstrom-thick AlGaAs etching barrier layer 18 is previously formed between an n+ layer 19 and a channel layer 20 by epitaxial growth (FIG. 3(a)). And a photoresist 21 is coated over the entire wafer surface, and only a wide recess of the inter-gate-drain region is opened. Then GaAs or AlGaAs is selectively dry etched, as indicated by 22, using $BCl_3+SF_6+CF_4$ (boron trichloride+sulphur hexafluoride+carbon tetrafluoride)to expose the etching barrier layer 18 (FIG. 3(b)). Then the photoresist 21 corresponding to the entire recess is opened, and the etching barrier layer 18 is exposed further at a wide recess of the inter-source-gate region and a prospective gate portion by wet etching, as indicated by 23, using one selected from citric acid compounds (FIG. 3(c)), thus forming a gate recess 7. These process steps are carried out as substitute for the process step of FIG. 7(a). Given that the gate recess 7 is formed, the inter-source-gate region has less surface damage while the inter-gate-drain region has a surface-damage layer. Subsequently the process steps of FIGS. 7(b) to 7(h) are repeated to obtain the field effect transistor of the present invention.

Figure 6:
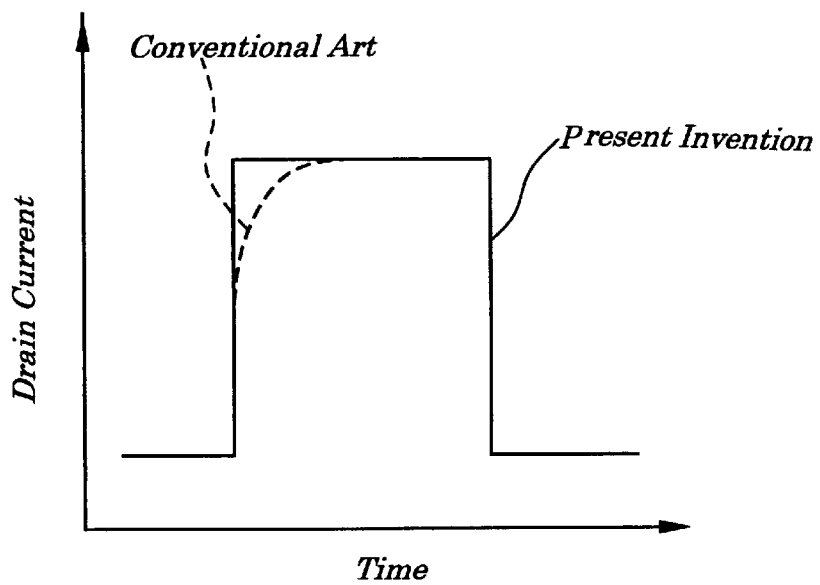
FIG. 6 is a graph showing a response waveform of a drain current with respect to a gate pulse input of the field effect transistor of the invention in comparison with that of the conventional field effect transistor.
Figure 7A:
FIGS. 7(a) to 7(h) are schematic cross-sectional view showing a succession of process steps of fabrication of the conventional field effect transistor.
Figure 7B:
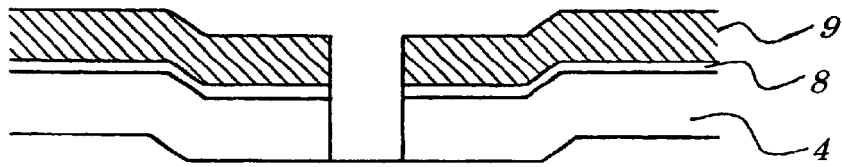
Figure 7C:
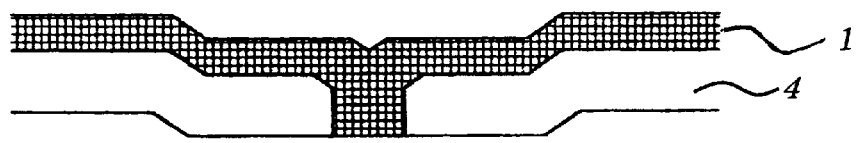
Figure 7D:
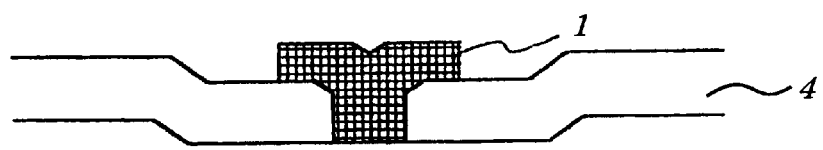
Figure 7E:
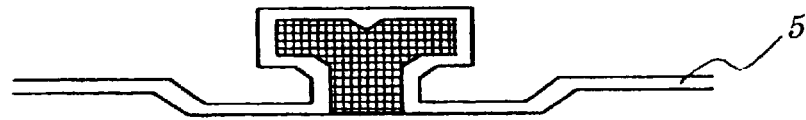
Figure 7F:
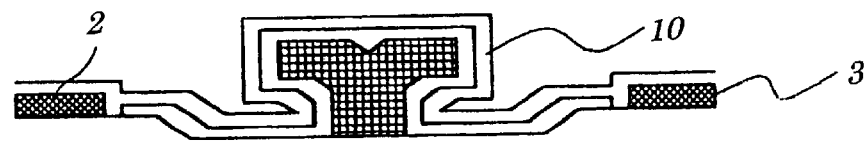
Figure 7G:
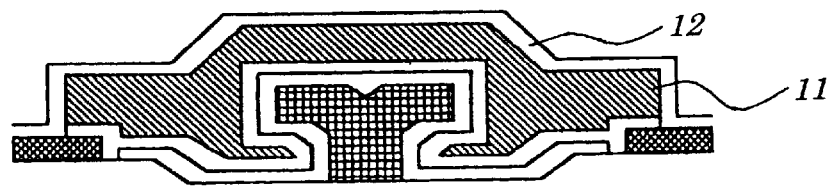
Figure 7H:
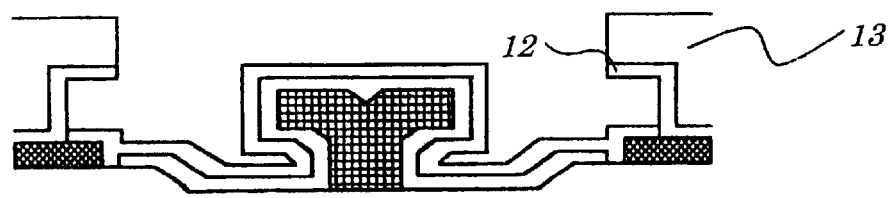

FIG. 6 is a graph showing a drain current response with respect to a 10-msec-cycle gate pulse applied to the gate electrode of the field effect transistor of the invention, in comparison with that of the conventional field effect transistor. In the conventional field effect transistor, as indicated by a dotted line, the drain current did rise not steeply, namely, a fault phenomenon called "a gate lag" occurs. Whereas in the field effect transistor of the present invention, the drain current did rise steeply so that a possible gate lag was prevented. This is an effect that the surface damages of the intrer-source-gate region were reduced.

Fourth Embodiment

Figure 4A:
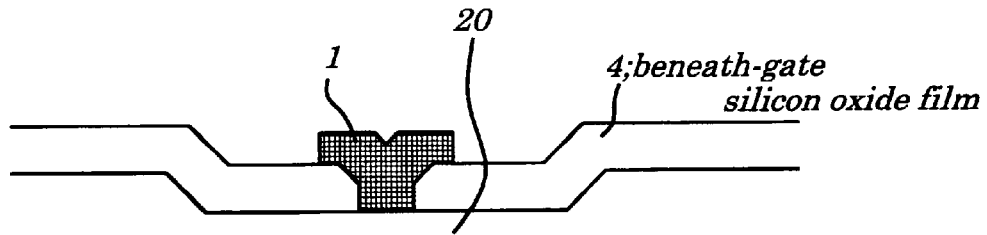
FIGS. 4(a) to 4(c) are schematic cross-sectional views showing a succession of process steps of fabrication of a field effect transistor according to a fourth embodiment of the invention.
Figure 4B:
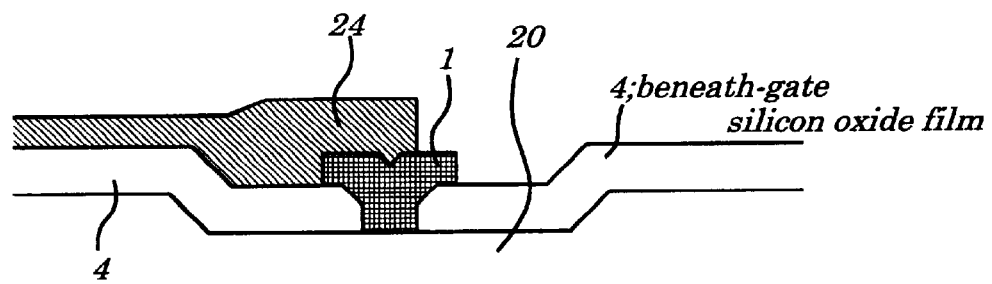
Figure 4C:
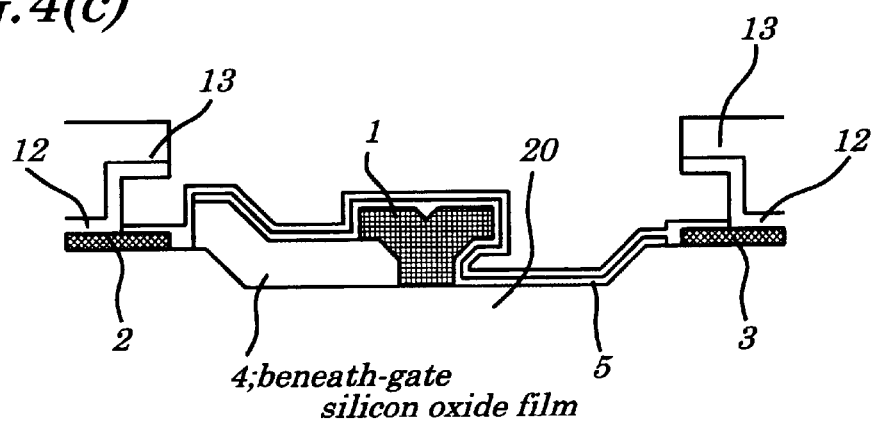

FIGS. 4(a) to 4(c) are schematic cross-sectional views showing a succession of process steps of fabrication of a field effect transistor according to a fourth embodiment of the invention. After the gate-forming process steps of FIGS. 7(a) to 7(d) have been carried out (FIG. 4(a)), a beneath-gate $SiO_2$ film 4 used as a mask is vapor etched, with a photoresist 24 as a mask, to remove only the inter-gate-drain region with the inter-source-gate region left unetched (FIG. 4(b)). Then a surface passivation film 5 is formed as conventional, and the usual process steps are carried out to complete an FET structure (FIG. 4(c)). Taking this structure, since the semiconductor surface of the inter-source-gate region is not exposed during the process steps, occurrences of traps in the interface of the oxide film and the semiconductor layer are reduced to a minimum. In the meantime, the inter-gate-drain region is more apt to have surface damages compared to the inter-source-gate region. As an alternative, the method of this embodiment may be combined with that of the second embodiment; namely, after the oxide film of the inter-gate-drain region has been removed, a preprocess prior to formation of the passivation film may be carried out by plasma irradiation so that the inter-gate-drain region can selectively have surface damages.

As mentioned above, according to the present invention, partly since a damage layer in which surface traps tend to be formed is introduced into the inter-gate-drain region, and partly since no damage layer is formed in the inter-source-gate region, it is possible to increase the breakdown voltage and, at the same time, to prevent a gate lag.

It is thus apparent that the present invention should by no means be limited to the illustrated embodiment and various modifications and changes may be suggested without departing from the scope and spirit of the invention.

Finally, the present application claims the priority of Japanese Patent Application No. Hei9-158557 filed on Jun. 16, 1997, which is herein incorporated by reference.

What is claimed is:

1. A field effect transistor comprising:

a source electrode;

a drain electrode;

a gate electrode; and a surface passivation film covering at least transistor surfaces of inter-source-gate and inter-gate-drain regions uncovered with their respective electrode metals;

surface traps to be provided over the semiconductor surface of said inter-gate-drain region being higher in number than those to be provided over the semiconductor surface of said inter-source-gate region.

2. A field effect transistor according to claim 1, further comprising a silicon oxide film formed on the semiconductor surface of said inter-source-drain region.

3. A field effect transistor according to claim 2, said silicon oxide film is deposited in a thickness of 1000 angstroms by thermal CVD.

4. A field effect transistor according to claim 1, further comprising a silicon oxide film formed on the semiconductor surface of said inter-source-drain region, and a silicon nitride film formed on the semiconductor surface of said inter-gate-drain region.

5. A field effect transistor according to claim 4, wherein said silicon oxide film is formed in a thickness of 1000 angstroms by low pressure CVD.

6. A field effect transistor according to claim 4, wherein said silicon nitride film is formed in a thickness of 1000 angstroms by plasma CVD.

7. A field effect transistor according to claim 1, wherein the semiconductor surface of said inter-gate-drain region is cleaned by direct plasma irradiation with the semiconductor surface of said inter-source-gate region left unexposed to plasma irradiation.

8. A field effect transistor according to claim 1, wherein the semiconductor surfaces of said inter-gate-drain and inter-source-gate regions has a recess in which said gate electrode is to be formed, said recess having a first section corresponding to said inter-gate-drain region and formed by dry etching and a second section corresponding to said inter-source-gate region and formed by wet etching.

9. A field effect transistor according to claim 1, further comprising a beneath-gate silicon oxide film formed for formation of said gate electrode, said silicon oxide film having a third section corresponding to said inter-gate-drain region being removed by etching, and a fourth section corresponding to an inter-source-gate region left unetched to form circuit elements.

10. A field effect transistor according to claim 9, wherein said beneath-gate silicon oxide film is vapor etched.

11. A field effect transistor according to claim 9, wherein after removed by dry etching, said third section of said beneath-gate silicon oxide film be cleaned by direct plasma irradiation.

* * * * *